(12) United States Patent
Yamaguchi et al.

(10) Patent No.: US 7,317,213 B2
(45) Date of Patent: Jan. 8, 2008

(54) SEMICONDUCTOR DEVICE HAVING SUPER JUNCTION STRUCTURE AND METHOD FOR MANUFACTURING THE SAME

(75) Inventors: Hitoshi Yamaguchi, Nisshin (JP); Tomoatsu Makino, Okazaki (JP); Yoshiyuki Hattori, Aichi-gun (JP); Kyoko Okada, Nagoya (JP)

(73) Assignee: DENSO CORPORATION, Kariya (JP)

( * ) Notice: Subject to any disclaimer, the term of this patent is extended or adjusted under 35 U.S.C. 154(b) by 33 days.

(21) Appl. No.: 11/211,524

(22) Filed: Aug. 26, 2005

(65) Prior Publication Data

US 2006/0043478 A1    Mar. 2, 2006

(30) Foreign Application Priority Data

Aug. 31, 2004    (JP)    ............................. 2004-252463

(51) Int. Cl.
 *H01L 29/74* (2006.01)
 *H01L 29/417* (2006.01)
 *H01L 31/111* (2006.01)
 *H01L 29/36* (2006.01)

(52) U.S. Cl. ...................... 257/120; 257/110; 257/341; 257/E29.005; 257/E21.361

(58) Field of Classification Search ................ 257/213, 257/183, 341–343, 339, 401, 348, 511, E21.345, 257/E21.418, E29.012, 110, 120, 126, 329, 257/E29.005, E29.027, E29.066, E21.361
See application file for complete search history.

(56) References Cited

U.S. PATENT DOCUMENTS

| 6,512,268 | B1 * | 1/2003 | Ueno ......................... 257/341 |
| 6,844,592 | B2 | 1/2005 | Yamaguchi et al. |
| 2001/0028083 | A1 * | 10/2001 | Onishi et al. ................ 257/328 |
| 2003/0222327 | A1 * | 12/2003 | Yamaguchi et al. ......... 257/500 |
| 2005/0184336 | A1 * | 8/2005 | Takahashi et al. ........... 257/328 |
| 2006/0043480 | A1 * | 3/2006 | Tsuchitani et al. .......... 257/341 |

* cited by examiner

*Primary Examiner*—Fernando L. Toledo
*Assistant Examiner*—Quovaunda Jefferson
(74) *Attorney, Agent, or Firm*—Posz Law Group, PLC (57) ABSTRACT

A semiconductor device includes: a center region; a periphery region; and a semiconductor layer including pairs of a first region having a first impurity amount and a second region having a second impurity amount. The first and the second regions are alternately aligned in a plane. The periphery region includes an utmost outer and an utmost inner periphery pairs. The utmost outer periphery pair has a difference between the second and the first impurity amounts, which is smaller than a maximum difference in the periphery region. The utmost inner periphery pair has a difference between the second and the first impurity amounts, which is larger than a difference in the center region.

7 Claims, 7 Drawing Sheets

SEMICONDUCTOR DEVICE HAVING SUPER JUNCTION STRUCTURE AND METHOD FOR MANUFACTURING THE SAME

CROSS REFERENCE TO RELATED APPLICATION

This application is based on Japanese Patent Application No. 2004-252463 filed on Aug. 31, 2004, the disclosure of which is incorporated herein by reference.

FIELD OF THE INVENTION

The present invention relates to a semiconductor device having a super junction structure and a method for manufacturing the same.

BACKGROUND OF THE INVENTION

Recently, it is required for a semiconductor device to increase withstand voltage and to reduce on-state resistance. Therefore, a SJ (super junction) structure type semiconductor device is well-known to have high withstand voltage and low on-state resistance. The SJ structure is formed in a drift layer of the device. The drift layer includes an N conductive type column (N column) and a P conductive type column (P column). The N column and the P column compose a unit as a pair of the SJ structure so that multiple pairs of the N column and the P column provide the SJ structure. The N column includes an N conductive type impurity, and the P column includes a P conductive type impurity. Further, the device is composed of a center region and a periphery region. In the center region, a semiconductor switching device is formed. In the periphery region, no semiconductor switching device is formed. Here, the drift layer is disposed from the center region to the periphery region.

When the device turns off, the N column and the P column in the SJ structure are depleted, respectively, since a depletion layer extending from each P-N junction boundary between the N column and the P column. Thus, the device has high withstand voltage. To deplete the N column and the P column completely and substantially, it is required to equalize impurity amounts of the N column and the P column. Specifically, the impurity amount of the N column is controlled to be equal to the impurity amount of the P column so that both columns are completely depleted. However, in the periphery region, when the impurity amounts of the N column and the P column are equalized, sufficient withstand voltage of the device is not obtained. This is because formation of the depletion layer in the periphery region is different from that in the center region, since a contact region for fixing electric potential of the P column is not formed in the periphery region. Here, in general, the electric potential of the P column is fixed to null, i.e., ground potential. In the periphery region, when the impurity amount of the N column is equalized to that of the P column, the N column and the P column in the periphery region are not sufficiently depleted, compared with the center region. Specifically, the depletion layer of the periphery region is smaller than that of the center region. Accordingly, the total withstand voltage of the device is limited to the withstand voltage of the periphery region. Thus, the withstand voltage of the device is reduced.

To improve the above problem, a semiconductor device with a periphery region and a center region, which have different impurity amounts, is disclosed in U.S. Pat. No. 6,844,592. Specifically, the P column in the periphery region has an excess impurity amount. In this case, the withstand voltage of the periphery region is improved so that the withstand voltage of the periphery region is equal to that of the center portion. Thus, the total withstand voltage of the device is improved.

The inventors have further studied about a SJ type semiconductor device. As a result, the inventors found new knowledge as follows. When the N column and the P column in the SJ structure are formed, the impurity amount of each column may be deviated. Specifically, the deviation of the impurity amount is caused by deviation of the impurity concentration and width of each column. The deviation of the impurity amount affects the withstand voltage of the device so that the withstand voltage is extremely reduced. This effect of the deviation is caused in the periphery region in particular. Thus, when the deviation of the impurity amount in the manufacturing process of the device deteriorates the withstand voltage, yielding ratio of product in the manufacturing process is reduced so that the total manufacturing cost increases.

SUMMARY OF THE INVENTION

In view of the above-described problem, it is an object of the present invention to provide a semiconductor device having a SJ structure. It is another object of the present invention to provide a method for manufacturing a semiconductor device having a SJ structure.

A semiconductor device includes: a center region, in which a semiconductor switching device is disposed; a periphery region surrounding the center region; and a semiconductor layer including a plurality of pairs of a first column having a first conductive type and a second column having a second conductive type. The semiconductor layer is disposed from the center region to the periphery region. The first and the second columns extend in a thickness direction of the device. The first and the second columns are alternately aligned in a plane perpendicular to the thickness direction of the device. The first column includes a first impurity amount, and the second column includes a second impurity amount. The periphery region includes an utmost outer periphery pair of the first and the second columns and an utmost inner periphery pair of the first and the second columns. The utmost inner periphery pair is disposed next to the center region, and the utmost outer periphery pair is disposed on outmost of the periphery region. The utmost outer periphery pair has a difference between the second impurity amount of the second column and the first impurity amount of the first column, the difference which is smaller than a maximum difference between the second impurity amount and the first impurity amount of another pair of the first and the second columns in the periphery region. The utmost inner periphery pair has a difference between the second impurity amount of the second column and the first impurity amount of the first column, the difference which is larger than a difference between the second impurity amount and the first impurity amount of a pair of the first and the second columns in the center region.

In the periphery region, the difference of the impurity amount of the utmost inner periphery pair in the periphery region is larger than that of the pair in the center region. For example, the second conductive type impurity amount of the utmost inner periphery region becomes excess. Thus, when the device turns off, the depletion layer proceeds from the center region to the periphery region so that the withstand voltage of the device is improved. Specifically, the reduction of the withstand voltage is limited to the withstand voltage of the periphery region as the upper limit. Thus, the device has high withstand voltage.

Further, the difference of the impurity amount of the utmost outer periphery pair in the periphery region is smaller than the maximum difference of the impurity amount of another pair in the periphery region. This utmost outer periphery pair is disposed at a portion, at which the electric filed is easily concentrated. Thus, even when the impurity amount of the first region and the second region in the periphery region is deviated in the manufacturing process, the concentration of the electric filed is relaxed. Thus, the withstand voltage of the device is improved.

Accordingly, the withstand voltage of the device having the SJ structure is improved, even when the impurity amount is deviated in the manufacturing process. Further, the method for manufacturing the SJ structure is easily performed. Thus, the yielding ratio of product is improved.

Further, a method for manufacturing a semiconductor device is provided. The device includes a semiconductor layer having a first column and a second column. The first column has a first conductive type and the second column has a second conductive type. The first and the second columns extend in a thickness direction of the device. The first and the second columns are repeated alternately in a plane perpendicular to the thickness direction. The method includes the steps of: forming a mask on a semiconductor wafer having the first conductive type, wherein the mask includes a center region mask, an inner periphery region mask and an outer periphery region mask, wherein the center region mask has a plurality of openings, each distance of which is constant, wherein the inner periphery region mask has a plurality of openings, each distance of which is smaller than the distance of the openings of the center region mask, wherein the outer periphery region mask has a plurality of openings, each distance of which is larger than the distance of the openings of the inner periphery region mask; forming a plurality of trenches on the semiconductor wafer through the openings of the mask by an anisotropic etching method; and forming a semiconductor region having the second conductive type in each trench.

The method provides the semiconductor device having the SJ structure. The withstand voltage of the device having the SJ structure is improved, even when the impurity amount is deviated in the manufacturing process. Further, the method for manufacturing the SJ structure is easily performed. Thus, the yielding ratio of product is improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
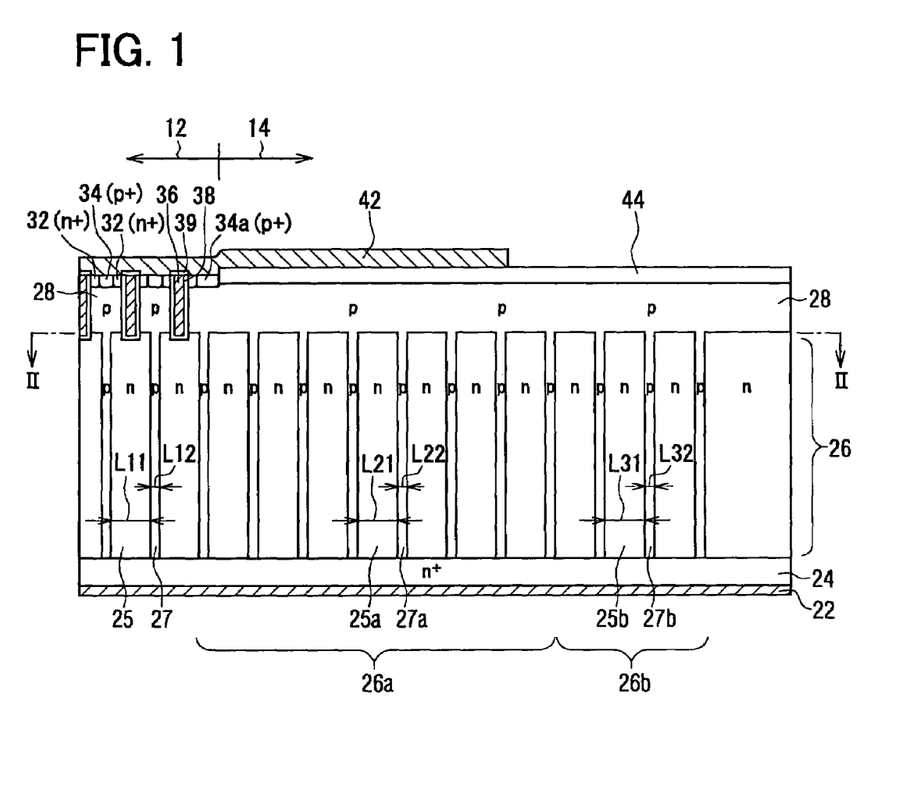
FIG. 1 is a partial cross sectional view showing a semiconductor device according to a first embodiment of the present invention.
Figure 2:
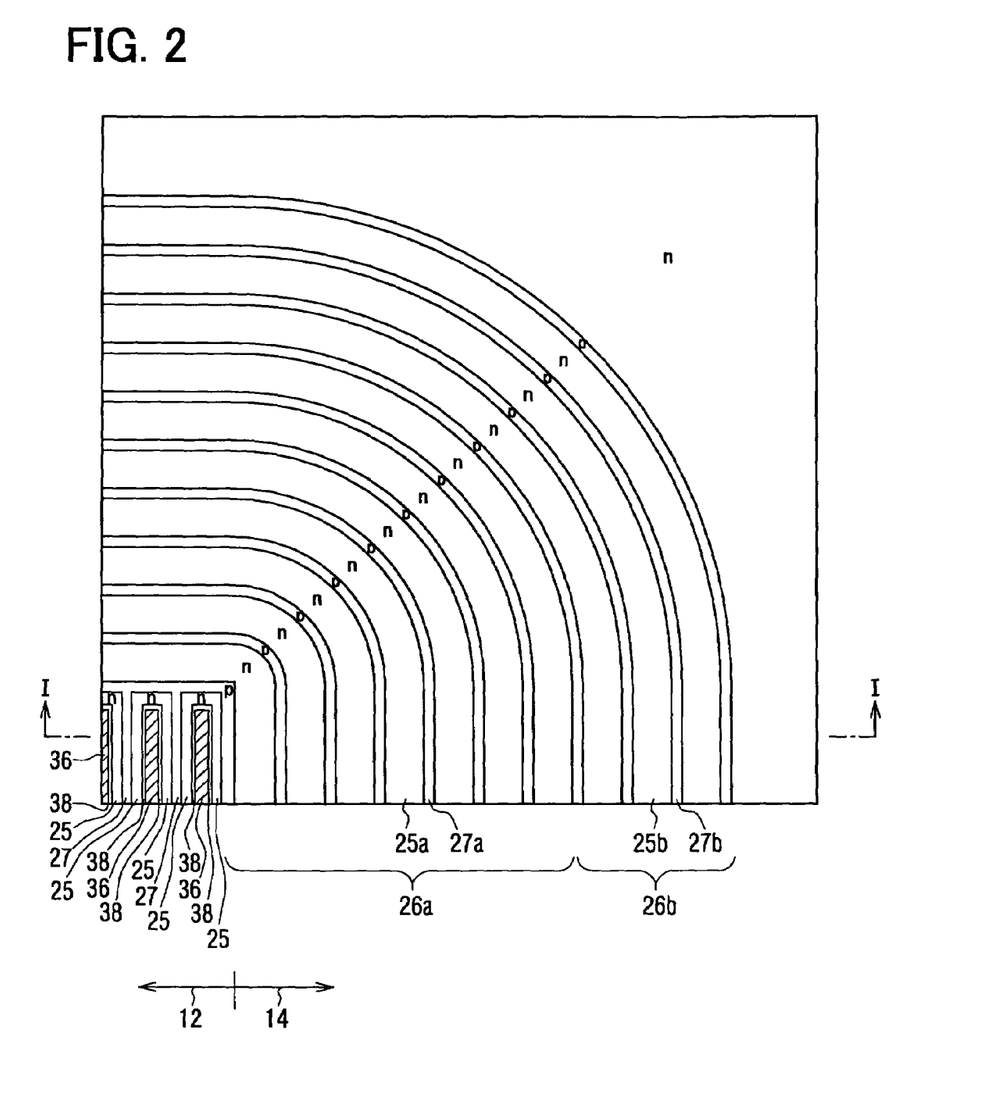
FIG. 2 is a partial plan view showing the device according to the first embodiment.

A semiconductor device having a super junction (i.e., SJ) structure according to a first embodiment of the present invention is shown in FIGS. 1 and 2. FIG. 1 is a partial cross sectional view showing a center region 12 and a periphery region 14 of the device. FIG. 2 is a partial plan view showing the device corresponding to line II-II in FIG. 1. Here, FIG. 1 shows the device taken along line I-I in FIG. 2. Specifically, FIG. 2 shows a main part of the device represents, specifically, a corner of the device.

The device is mainly made of silicon-based semiconductor. However, the device can be made of another semiconductor material.

As shown in FIG. 1, the center region 12 includes a semiconductor switching device, and the periphery region 14 is disposed around the center region 12. In this device, the switching device is formed of a MOSFET. Specifically, the device includes a $N^+$ conductive type (i.e., $N^+$) drain layer 24, a drift layer 26 as an example of a semiconductor layer, and a P conductive type (i.e., P) body layer 28, which are stacked in this order. Thus, the device has a stacked structure. This structure is formed from the center region 12 to the periphery region 14. The drain layer 24 connects to a drain electrode 22. The drift layer 26 includes an N column and a P column, which extend in a vertical direction, i.e., a thickness direction. The N column and the P column are repeatedly formed in a plane perpendicular to the vertical direction. The plane corresponds to the drawing of FIG. 2. A part of the body layer 28 disposed in the periphery region 14 is a resurf (reduced-surface-field) layer.

The width of each N column is different. Specifically, the N column is classified into three types of the N columns. One is an N column 25 in the center region 12. Another one is an N column 25a, which is disposed in the first part of the periphery region 14. The first part of the periphery region 14 is disposed in a range between an utmost inner side of the periphery region 14 and the seventh pair of the N column 25a and the P column 27a. The last one is an N column 25b, which is disposed in the second part of the periphery region 14. The second part of the periphery region 14 is disposed in a range between the eighth pair and the tenth pair of the N column 25b and the P column 27b, so that the second part of the periphery region 14 is a residual part of the periphery region 14 except for the first part. Similarly, the P column is also classified into three types of the P columns. One is a P column 27 in the center region 12. Another one is a P column 27a, which is disposed in the first part of the periphery region 14. The last one is a P column 27b, which is disposed in the second part of the periphery region 14. Here, the first part of the periphery region 14 is an inner periphery region 26a, which includes the N column 25a and the P column 27a. The second part of the periphery region 14 is an outer periphery region 26b, which includes the N column 25b and the P column 27b.

FIG. 2 shows the plane perpendicular to the thickness direction of the drift layer 26. The N column 25 and the P column 27 in the center region 12 substantially provide a thin plate so that they are repeatedly disposed in one direction parallel to the surface of the device. The N column 25a and the P column 27a in the inner periphery region 26a and the N column 25b and the P column 27b in the outer periphery region 26b surround the center region 12. Accordingly, the inner periphery region 26a and the outer periphery region 26b surround the center region 12 in this order.

The N column 25 and the P column 27 in the center region 12 are alternately formed along with a repeat direction, which is perpendicular to a thickness direction of the device. The N columns 25a, 25b and the P columns 27a, 27b in the inner and the outer periphery regions 26a, 26b are alternately formed along with repeat directions, respectively. The repeat directions of the inner and the outer periphery regions 26a, 26b vary with location. Therefore, by some location, the repeat direction of the center region 12 is in parallel to the repeat directions of the inner and the outer periphery regions 26a, 26b. By the other locations, the repeat direction of the center region 12 is not in parallel to the repeat directions of the inner and the outer periphery regions 26a, 26b. However, the N column 25 and the P column 27 in the center region 12 are repeated in the plane perpendicular to the vertical direction (i.e., the thickness direction) of the device. Further, the N columns 25a, 25b and the P columns 27a, 27b in the inner and the outer periphery region 26a, 26b are repeated in the plane perpendicular to the vertical direction of the device.

The center region 12 is described in detail as follows. A source region 32 having the N conductive type and a contact region 34 having the P conductive type are selectively formed on the surface of the body region 28 in the center region 12. Further, a trench gate electrode 36 is formed in the center region 12. The trench gate electrode 36 penetrates the body region 28, which separates the source region 32 and the N column 25. The trench gate electrode 36 is covered with a gate insulation film 38. A source electrode 42 is formed in the center region 12. The source electrode 42 electrically connects between the source region 32 and the contact region 34. The source electrode 42 and the trench gate electrode 36 are separated with an insulation film 39 electrically. The source electrode 42 extends in a part of an insulation film 44. The insulation film 44 covers the surface of the periphery region 14. The surface electrode 42 extends from the center region side to the periphery region side. The source electrode 42 extends in the inner periphery region 26a, and the source electrode 42 is disposed on the insulation layer 44. Specifically, the inner periphery region 26a is formed to exceed a portion, in which the source electrode 42 is disposed.

A part of the contact region 34 disposed on an utmost outer periphery of the center region 12 is an outer contact region 34a. The center region 12 is disposed inside of the outer contact region 34a, and the periphery region 14 is disposed outside of the outer contact region 34a.

Figure 3:
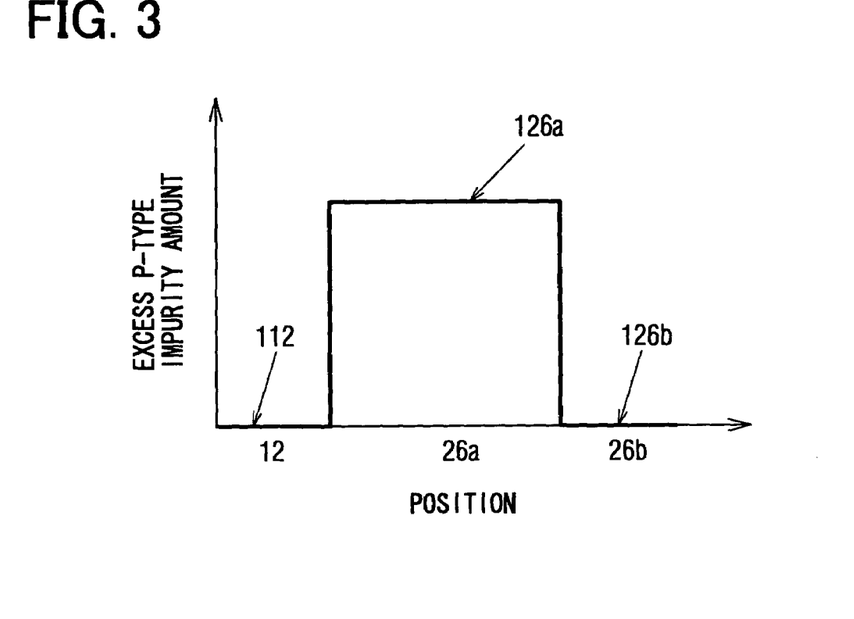
FIG. 3 is a graph showing a relationship between a position and excess P type impurity amount, according to the first embodiment.

FIG. 3 shows excess P type impurity amount in the center region 12, the inner periphery region 26a and the outer periphery region 26b. The excess P type impurity amount is obtained by subtracting the impurity amount of the N column 25, 25a, 25b from the impurity amount of the P column 27, 27a, 27b. Here, the width of each P column 27, 27a, 27b is equal to 0.66 μm. The width L12 of the P column 27, the width L22 of the P column 27a, and the width L32 of the P column 27b are the same. On the other hand, the width of each N column 25, 25a, 25b is different. Therefore, the width L11 of the N column 25, the width L21 of the N column 25a and the width L31 of the N column 25b are different. Specifically, the width L11 of the N column 25 in the center region 12 is 2.0 μm. The width L21 of the N column 25a in the inner periphery region 26a is 1.9 μm. The width L31 of the N column 25b in the outer periphery region 26b is 2.0 μm. The impurity concentration of each P column 27, 27a, 27b is constant. The impurity concentration of each N column 25, 25a, 25b is constant. Accordingly, the impurity amount of each column 25, 25a, 25b, 27, 27a, 27b is controlled by the width of the column 25, 25a, 25b, 27, 27a, 27b. Specifically, the impurity amount is controlled by the width L11, L21, L31 of each N column 25, 25a, 25b. The width L21 of the N column 25a in the inner periphery region 26a is shorter than that in the outer periphery region 26b and the center region 12 by 5%. Therefore, the impurity amount of the P conductive type impurity in the inner periphery region 26a excesses about 5%, compared with other regions such as the outer periphery region 26b and the center region 12. Thus, as shown in FIG. 3, the excess P type impurity amount of the inner periphery region 26a is about 5% larger than those of the outer periphery region 26b and the center region 12.

Thus, the impurity amount of the N column 25 in the center region 12 is substantially equal to that of the P column 27 in the center region 12 so that charge in the center region 12 is balanced. Accordingly, the difference 112 of the impurity amount between the N column 25 and the P column 27 in the center region 12 is controlled to be zero. Similarly, the difference 126b of the impurity amount between the N column 25b and the P column 27b in the outer periphery region 26b is controlled to be zero. However, the width L21 of the N column 25a in the inner periphery region 26a is narrower than the width L22 of the P column 27a, so that the impurity amount of the P conductive type impurity of the P column 27a is relatively larger than the impurity amount of the N conductive type impurity of the N column 25a. Thus, the difference 126a of the impurity amount between the N column 25a and the P column 27a in the inner periphery region 26a is controlled not to be zero. Thus, the difference 126b of the impurity amount in the outer periphery region 26b is smaller than the difference 126a of the impurity amount in the inner periphery region 26a. Here, the outer periphery region 26b is composed of three pairs of the N and the P columns 25b, 27b, and includes the utmost outer periphery pair. The inner periphery region 26a is composed of seven pairs of the N and the P columns 25a, 27a, and includes the utmost inner periphery pair. Thus, the difference 126b of the impurity amount of the utmost outer periphery pair of the N and the P columns 25b, 27b in the outer periphery region 26b is smaller than that 126a of one pair of the N and the P columns 25a, 27a in the inner periphery region 26a. The difference 126a of the impurity amount of the utmost inner periphery pair of the N and the P columns 25a, 27a in the inner periphery region 26a is larger than that 112 of one pair of the N and the P columns 25, 27 in the center periphery region 12.

Although the impurity amount of each column 25, 25a, 25b, 27, 27a, 27b is controlled by changing the width L11, L21, L31 of the N column 25, 25a, 25b, the impurity amount can be controlled by changing the impurity concentration without changing the width of the column.

Figure 4:
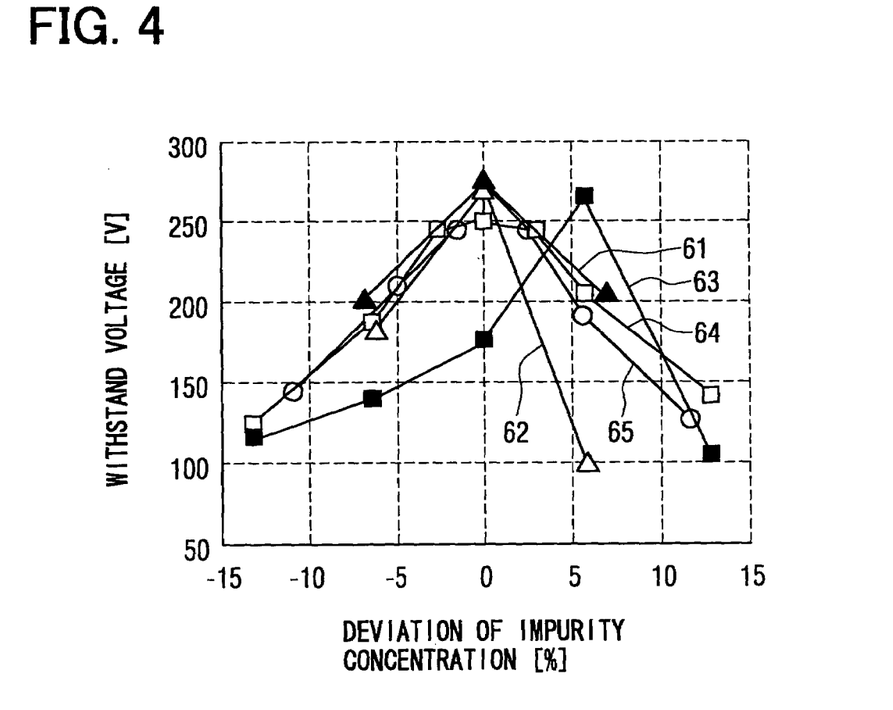
FIG. 4 is a graph showing a relationship between a deviation of the impurity concentration and a withstand voltage, according to the first embodiment.

FIG. 4 shows a relationship between the withstand voltage of the center region 12 and the periphery region 14 and the deviation of the impurity concentration in the column 25, 25a, 25b, 27, 27a, 27b. Here, a graph 61 represents a relationship between the deviation of the impurity concentration in the P column 27a, 27b of the periphery region 14 and the withstand voltage of the periphery region 14 in a case where the width of the N column 25a in the inner periphery region 26a is 1.9 μm and the width of the N column 25b in the outer periphery region 26b is 2.0 μm. A graph 62 represents a relationship between the deviation of the impurity concentration in the P column 27a, 27b of the periphery region 14 and the withstand voltage of the periphery region 14 in a case where the width of the N column 25a in the inner periphery region 26a is 1.9 μm and the width of the N column 25b in the outer periphery region 26b is 1.9 μm. A graph 63 represents a relationship between the deviation of the impurity concentration in the P column 27a, 27b of the periphery region 14 and the withstand voltage of the periphery region 14 in a case where the width of the N column 25a in the inner periphery region 26a is 2.0 μm and the width of the N column 25b in the outer periphery region 26b is 2.0 μm. A graph 64 represents a relationship between the deviation of the impurity concentration in the P column 27 of the center region 12 and the withstand voltage of the center region 12. A graph 65 represents a relationship between the deviation of the impurity concentration in the N column 25 of the center region 12 and the withstand voltage of the center region 12.

Here, the deviation of the impurity concentration is obtained by the following formula.

$$DC = \frac{(CC - CB)}{CB} \times 100$$

Here, DC represents the deviation of the impurity concentration, CC represents change (i.e., deviation) of the impurity concentration, and CB represents a charge balance concentration. The charge balance concentration CB is defined by the impurity concentration of each column 25, 25a, 25b, 27, 27a, 27b when the difference of the impurity amount between the N column 25, 25a, 25b and the P column 27, 27a, 27b becomes zero in a case where the width of the N column is 2.0 μm and the width of the P column is 0.66 μm.

Regarding the graphs 64, 65 shown in FIG. 4, in the center region 12, when the N column 25 and the P column 27 are charge-balanced, i.e., when the charge in the N column 25 is balanced with the charge in the P column 27, the maximum withstand voltage is obtained. Here, the maximum withstand voltage is about 250 V. Accordingly, in this case, i.e., under the charge balance condition (i.e., the deviation of the impurity concentration is zero %), the N column 25 and the P column are completely depleted. Further, the graphs 64, 65 are axisymmetric with the maximum withstand voltage as the symmetric center. When the impurity concentration is changed positively or negatively, the withstand voltage is reduced slightly. Specifically, even when the impurity amount is changed by ±5%, the withstand voltage can be equal to or larger than 200V. Accordingly, in the center region 12, even if the impurity concentration is deviated the reduction of the withstand voltage is comparatively small.

On the other hand, regarding the graph 63, in the periphery region 14, when the N column and the P column are charge-balanced, the withstand voltage is decreased. In this case, the withstand voltage is about 170V. Further, when the impurity amount of the P column 27a, 27b in the periphery region 14 is larger than that of the N column 25a, 25b by 5%, the maximum withstand voltage is obtained. In this case, the maximum withstand voltage is about 270V. Here, when the impurity amount of the N column 25a, 25b in the periphery region 14 is smaller than that of the P column 27a, 27b by 5%, the maximum withstand voltage of 270V is obtained. This is because the condition of +5% large impurity amount of the P column is the same as the condition of −5% small impurity amount of the N column. Thus, when the width of the N column 25 in the center region 12 and the width of the N column 25a, 25b in the periphery region 14 are equalized, and the charge between the P column and the N column is balanced, the withstand voltage of the periphery region 14 is reduced. Therefore, the total withstand voltage of the device is reduced.

Regarding the graph 62, when the width of the N column 25a, 25b in the periphery region 14 is 1.9 μm, and the charge between the P column 27a, 27b and the N column 25a, 25b is balanced, the impurity amount of the P column 27a, 27b in the periphery region 14 is larger than that of the N column 25a, 25b by 5%. This is because the width of the N column 25a, 25b is 1.9 μm; and therefore, the impurity amount of the P column 27a, 27b becomes larger than that of the N column 25a, 25b although the charge of the P column 27a, 27b is balanced to the charge of the N column 25a, 25b. In this case, the maximum withstand voltage of the periphery region of 270V is obtained. Thus, the condition where the maximum withstand voltage of the center region 12 is obtained coincides with the condition where the maximum withstand voltage of the periphery region 14 is obtained. Specifically, the width of the N column 25 in the center region 12 is set to be 2.0 μm, the width of the N column 25a, 25b in the periphery region 14 is set to be 1.9 μm, and the P column 27, 27a, 27b and the N column 25, 25a, 25b are charge-balanced. In this case, the maximum withstand voltage of the center region 12 is obtained, and further, the maximum withstand voltage of the periphery region 14 is obtained. Here, the width of each P column 27, 27a, 27b in the center region 12 and the periphery region 14 is 0.66 μm. Accordingly, the total withstand voltage of the device is optimized to be the maximum total withstand voltage. Thus, the device has the high withstand voltage.

However, as shown the graph 62 in FIG. 4, when the impurity concentration of the P column 27a, 27b in the periphery region 14 is deviated by +5%, the withstand voltage of the periphery region 14 is rapidly decreased. When the impurity concentration is deviated by +5%, the withstand voltage becomes to be 100V. When the device is manufactured, the impurity concentration may be deviated from the target impurity concentration. In this case, the withstand voltage may be reduced so that the target withstand voltage of the device is not obtained. Thus, the yielding ratio of production of the device is decreased.

On the other hand, as shown the graph 61, even when the impurity concentration of the P column 27a, 27b in the periphery region 14 is deviated by +5% or −5%, the withstand voltage of the periphery region 14 is gradually reduced. Thus, even when the impurity concentration of the P column 27a, 27b in the periphery region 14 is deviated positively or negatively, the reduction of the withstand voltage of the periphery region 14 is limited. Specifically, when the impurity concentration is deviated by +5% or −5%, the withstand voltage of the periphery region 14 becomes to be 220V. Further, the graph 61 is axisymmetric with the maximum withstand voltage as the symmetric center. Thus, the graph 61 is similar to the graphs 64, 65, so that the change of the withstand voltage in accordance with the deviation of the impurity concentration in the graph 61 is substantially equal to that in the graphs 64, 65. Thus, even when the impurity concentration is deviated during the manufacturing process of the device, the reduction of the withstand voltage is limited. Thus, the total withstand voltage of the device is not reduced largely. Thus, the yielding ratio of production of the device is not decreased. Specifically, in this case, the width of the N column 25a in the inner periphery region 26a is set to be 1.9 μm, the width of the N column 25b in the outer periphery region 26b is set to be 2.0 μm, and the width of the N column 25 in the center region 12 is set to be 2.0 μm. The width of each P column 27, 27a, 27b in the center region 12 and the periphery region 14 is set to be 0.66 μm. The P column 27, 27a, 27b and the N column 25, 25a, 25b are charge-balanced. Thus, the condition where the maximum withstand voltage of the center region 12 is obtained coincides with the condition where the maximum withstand voltage of the periphery region 14 is obtained. In this case, even when the manufacturing deviation of the device is occurred, the withstand voltage is not reduced largely. Thus, the yielding ratio of product of the device is increased.

Figure 5:
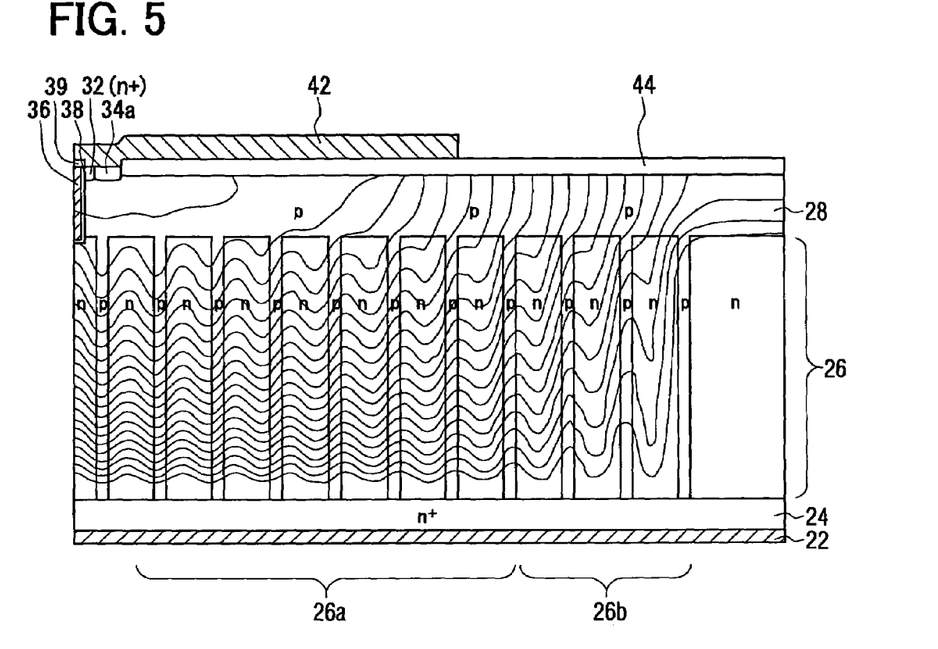
FIG. 5 is a cross sectional view showing electric potential distribution in a periphery region of the device, according to the first embodiment.
Figure 6:
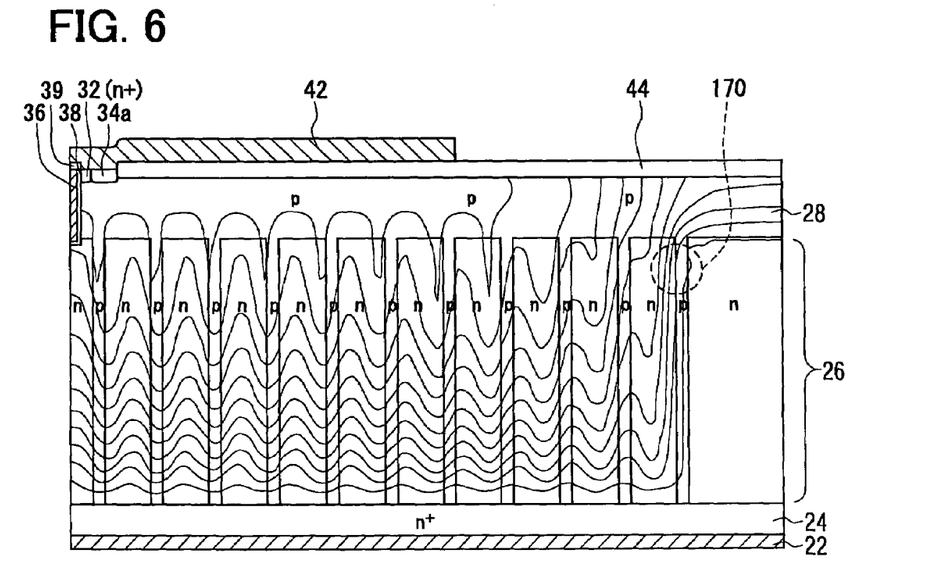
FIG. 6 is a cross sectional view showing electric potential distribution in a periphery region of a comparison device.

FIG. 5 shows potential distribution of the periphery region 14 of the device corresponding to the graph 61 in FIG. 4. FIG. 6 shows potential distribution of the periphery region 14 of the device corresponding to the graph 62 in FIG. 4.

Firstly, as shown in FIG. 6, the electric field is concentrated at the utmost outer periphery pair 170 in the periphery region 14. Therefore, a break down of the device is occurred at the utmost outer periphery pair 170. As shown the graph 62 in FIG. 4, when the width of each N column 25a, 25b in the periphery region 14 is set to be 1.9 μm, the condition where the maximum withstand voltage of the periphery region 14 is obtained coincides with the condition where the maximum withstand voltage of the center region 12 is obtained. However, when the impurity concentration is deviated slightly, the electric field is excessively concentrated at the utmost outer periphery pair 170. Therefore, the break down is occurred at the utmost outer periphery pair 170 before the depletion proceeds from the center region 12 to the periphery region 14. Accordingly, even when the impurity concentration is deviated slightly, the withstand voltage of the periphery region 14 is rapidly reduced.

On the other hand, in FIG. 5, the width of the N column 25b disposed in the outer periphery region 26b is formed to be 2.0 μm. Accordingly, the impurity amount of the P column in the outer periphery region 26b is not excess, compared with the impurity amount of the P column in the inner periphery region 26a. Therefore, the electric field concentration at the utmost outer periphery pair is modified. Thus, the depletion proceeds from the center region 12 to the periphery region 14 before the break down is occurred at the utmost outer periphery pair. Thus, even when the impurity concentration is deviated, the reduction of the withstand voltage is limited.

Next, a method for manufacturing the device according to this embodiment is described below. Specifically, the method for forming the drift layer 26 is described with reference to FIGS. 7 to 11. Here, the other parts of the device can be formed by a conventional semiconductor process.

Figure 7:
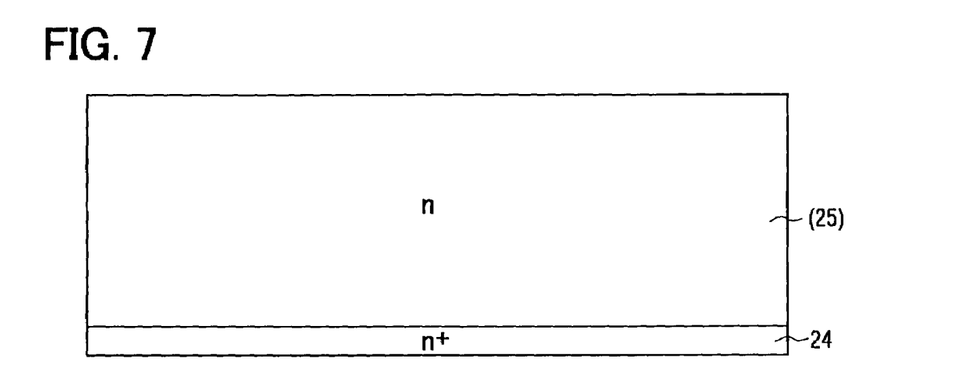
FIG. 7 is a cross sectional view explaining a method for manufacturing a drift layer, according to the first embodiment.

As shown in FIG. 7, an epitaxial substrate is prepared. The epitaxial substrate includes a N type epitaxial layer (25) for providing the N column 25, 25a, 25b and a semiconductor layer as the drain layer 24 having the N$^+$ conductive type with high impurity concentration. The N type epitaxial layer (25) is formed on the semiconductor layer.

Figure 8:
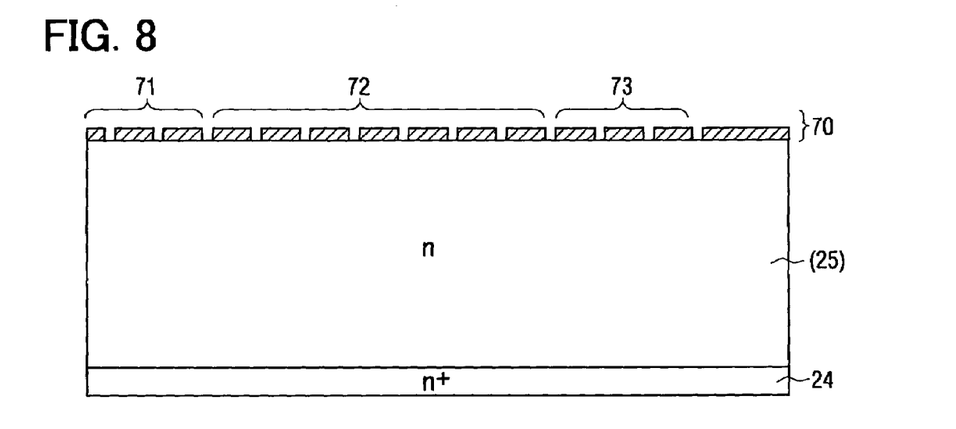
FIG. 8 is a cross sectional view explaining the method for manufacturing the drift layer, according to the first embodiment.

Next, as shown in FIG. 8, a mask layer 70 is formed on the N type epitaxial layer (25). The mask layer 70 has multiple openings, which are formed by a photo lithography method. The mask layer 70 includes three parts having different opening distance. The opening distance is shown as a lateral width of the mask layer 70 in FIG. 8. The mask layer 70 is formed of an integral unit, although the mask layer 70 includes three parts. One of the mask layer 70 is a center mask layer 71 corresponding to the center region 12 so that the center mask layer 71 defines the first region. Another one of the mask layer 70 is an inner periphery mask layer 72 corresponding to the inner periphery region 26a so that the inner periphery mask layer 72 defines the second region. The inner periphery mask layer 72 surrounds the center mask layer 71. The last one of the mask layer 70 is an outer periphery mask layer 73 corresponding to the outer periphery region 26b so that the outer periphery mask layer 73 defines the third region. The outer periphery mask layer 73 surrounds the center mask layer 71 and the inner periphery mask layer 72.

The inner periphery mask layer 72 has multiple openings, and a distance between the neighboring two openings is smaller than that of the center mask layer 71. The outer periphery mask layer 73 has multiple openings, and a distance between the neighboring two openings is larger than that of the inner periphery mask layer 72.

Figure 9:
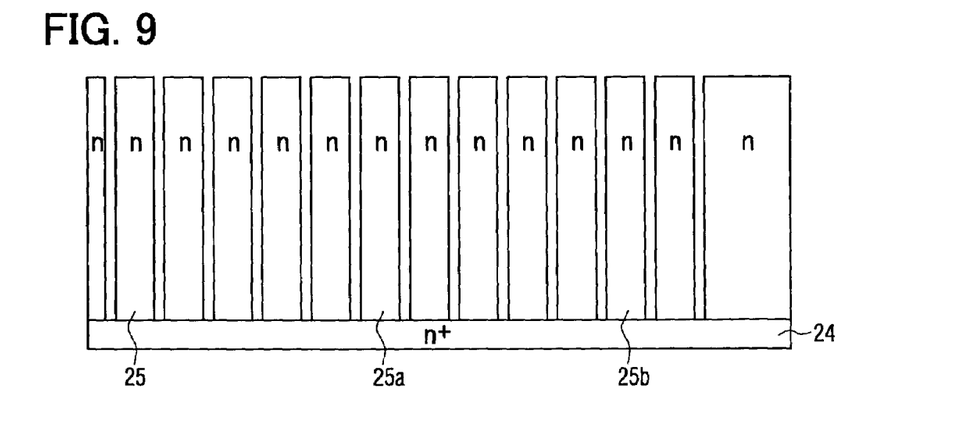
FIG. 9 is a cross sectional view explaining the method for manufacturing the drift layer, according to the first embodiment.

Next, as shown in FIG. 9, a part of the N type epitaxial layer (25) exposed through the openings of the mask layer 70 is anisotropically etched by a dry-etching method such as a RIE method so that a trench is formed. Thus, the N columns 25, 25a, 25b are formed. The width of each N column 25, 25a, 25b is controlled appropriately. Each N column 25, 25a, 25b is separated by the trench. Then, the mask layer 70 is removed.

Figure 10:
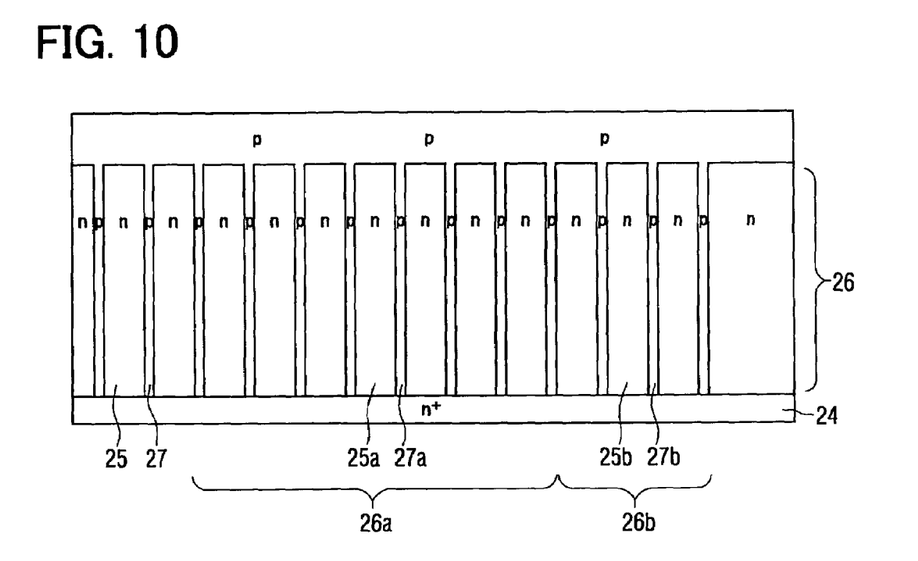
FIG. 10 is a cross sectional view explaining the method for manufacturing the drift layer, according to the first embodiment.
Figure 11:
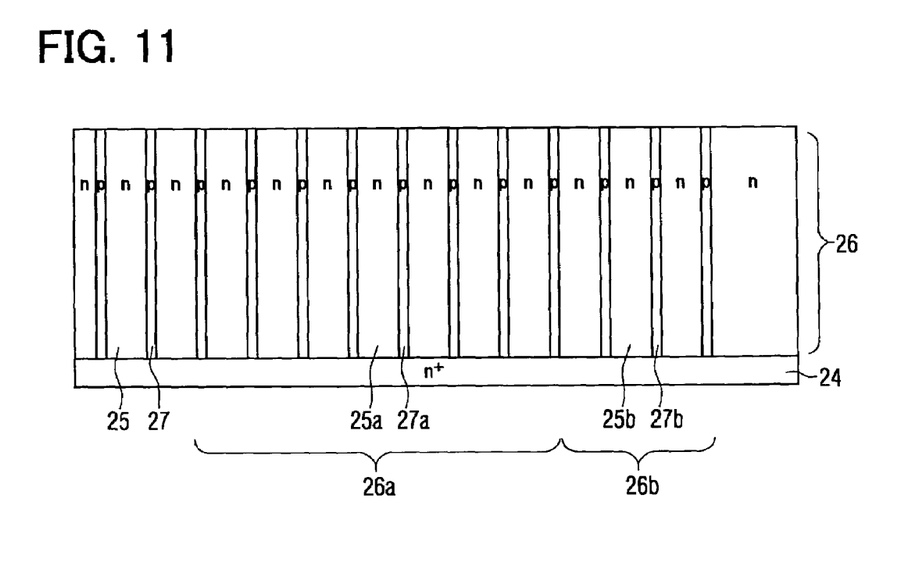
FIG. 11 is a cross sectional view explaining the method for manufacturing the drift layer, according to the first embodiment.

Next, as shown in FIG. 10, the P column 27, 27a, 27b is embedded in the trench by an embedding epitaxial growth method. Thus, the SJ structure having the N column 25, 25a, 25b and the P column 27, 27a, 27b is formed. Here, the width of each trench is the same. Therefore, the P column 27, 27a, 27b can be formed in each trench homogeneously. Thus, the difference of impurity amount between the P column and the N column is controlled appropriately and the total impurity amount of the P column and the N column is also controlled appropriately. Thus, the drift layer 26 is formed.

Next, the P type semiconductor layer covering the surface of the device is polished and removed if necessary. When the P type semiconductor layer is used as a body region, a part of the P type semiconductor layer is removed, i.e., the removed portion of the P type semiconductor layer is controlled appropriately.

Then, other parts such as electrodes and semiconductor regions can be formed by a conventional semiconductor process. Thus, the device having the drift layer 26 is completed.

Second Embodiment

Figure 12:
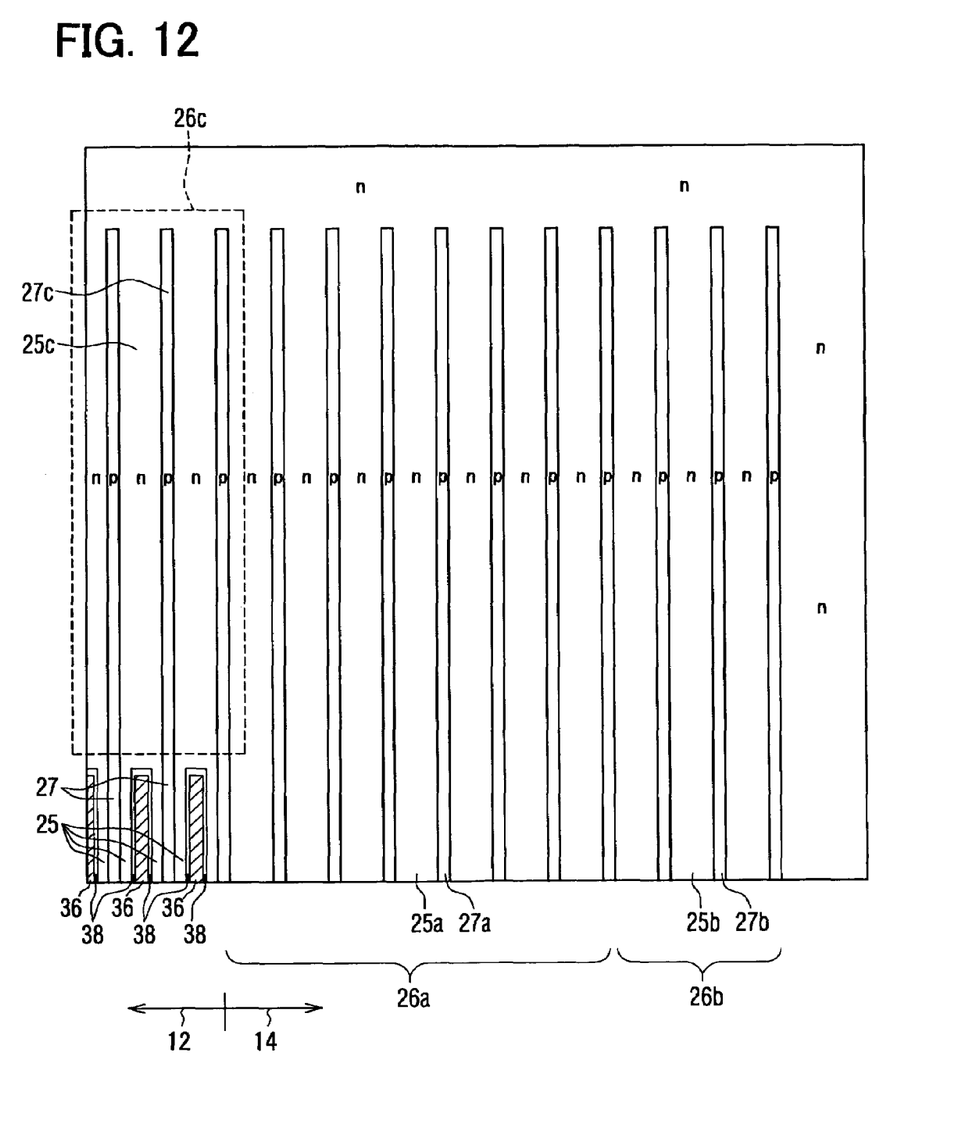
FIG. 12 is a partial plan view showing a semiconductor device according to a second embodiment of the present invention.

A semiconductor device having a SJ structure according to a second embodiment of the present invention is shown in FIG. 12.

The N columns 25 and the P columns 27 in the center region 12 are repeated alternately in a horizontal direction. The N columns 25a, 25b and the P columns 27a, 27b in the inner and the outer periphery regions 26a, 26b are also repeated alternately in the same horizontal direction. The periphery region 14 includes three parts which are composed of the inner and the outer periphery regions 26a, 26b and the third periphery region 26c. The third periphery region 26c includes the N column 25c and the P column 27c, which are formed to extend from the N column 25 and the P column in the center region 12. Thus, the width of the N column 25c in the third periphery region 26c is equal to the width of the N column 25 in the center region 12. Further, the width of the P column 27c in the third periphery region 26c is equal to the width of the P column 27 in the center region 12. The impurity amounts of the N column 25c and the P column 27c in the third periphery region 26c cannot be controlled appropriately so that the difference of the impurity amount between the N column 25c and the P column 27c in the third periphery region 26c is not changed compared with the center region 12. In this case, the withstand voltage of the third periphery region 26c may be reduced. However, when the length of the third periphery region 26c is sufficiently long, the reduction of the withstand voltage of the third periphery region 26c is limited without using the above mentioned technique according to the first embodiment.

Thus, the width of the N column 25a in the inner periphery region 26a is different from that in the outer periphery region 26b. Specifically, the width of each N column 25a, 25b is changed in the horizontal direction only.

The technique according to the first embodiment is used in a region, the withstand voltage of which is reduced, so that the reduction of the total withstand voltage of the device is limited.

In this case, even when the impurity amount is deviated, sufficient withstand voltage of the device is obtained.

The device shown in FIG. 12 can be manufactured by using a mask having multiple openings, which are aligned in line in the horizontal direction.

(Modifications)

Although the device shown in FIG. 1 includes the body layer as the resurf layer, the device can have no resurf layer.

Although the device in FIG. 1 includes ten pairs of the N column 25, 25a, 25b and the P column 27, 27a, 27b, the number of pairs of the N column and the P column can be other numbers.

Although the excess impurity amount in the inner periphery region 26a is changed from zero to a predetermined value with rectangular shape shown in FIG. 3, the excess impurity amount in the inner periphery region 26a can be changed stepwise.

Preferably, the total impurity amount of the N column 25b and the P column 27b in the outer periphery region 26b is equal to or smaller than the total impurity amount of the N column 25 and the P column 27 in the center region 12. This is because the electric filed concentration at the outer periphery region 26b is reduced by reducing the impurity amount in the outer periphery region 26b.

Although the difference 126a of the impurity amount between the N column 25a and the P column 27a is controlled by the width of the N column 26a, the difference 126a can be controlled by the width of the P column 27a. Further, the difference 126a can be controlled by the impurity concentration of each column 25a, 27a.

Furthermore, the difference 126a can be controlled by a combination of the width of each column and the impurity concentration of each column.

Although the semiconductor device is a MOSFET (i.e., metal oxide silicon field effect transistor), the semiconductor device can be another device such as an IGBT (i.e., insulated gate bipolar transistor), a SIT (i.e., static induction transistor) and a SBT (i.e., shottky barrier diode).

Although the N column 25, 25a, 25b and the P column 27, 27a, 27b have a rectangular shape, the N and the P columns can have other shape such as a thin plate shape, a quadrangular prism shape, and a hexagonal cylinder shape. Further, although the N columns 25, 25a, 25b and the P columns 27, 27a, 27b are alternately aligned, the second columns can be dispersed in the first region instead of the first column, the first region which spreads in the plane perpendicular to the thickness direction. Thus, the device includes at least the first region and the second region, a pair of which is repeated alternately in one direction.

Here, U.S. Pat. No. 6,844,592 discloses that the difference of the impurity amount of the N column and the P column in the periphery region is homogeneous. Accordingly, the device shown in FIG. 1 having the difference of the impurity amount of the N column and the P column, which is distributed in the periphery region, is different from U.S. Pat. No. 6,844,952. The distribution of the difference is such that the difference of the impurity amount in the inner periphery region is different, i.e., larger than that in the outer periphery region.

Specifically, in the device disclosed in U.S. Pat. No. 6,844,952, when the impurity amount of the first region and the second region is deviated, the withstand voltage of the device is rapidly reduced. However, in the present invention, even when the impurity amount of the first region and the second region is deviated, the withstand voltage of the device is not rapidly reduced.

Further, in the present invention, the inner periphery region and the outer periphery region are disposed to surround the centre region in this order, so that the depletion layer homogeneously expands from the center region to the periphery region. Furthermore, the inner periphery region is disposed to protrude from the source electrode, so that the depletion is performed in the periphery region completely.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
    a center region, in which a semiconductor switching device is disposed;
    a periphery region surrounding the center region; and a semiconductor layer including a plurality of pairs of a first region having a first conductive type and a second region having a second conductive type, wherein
the semiconductor layer is disposed from the center region to the periphery region,
the first and the second regions extend in a thickness direction of the device,
the first and the second regions are alternately aligned in a plane perpendicular to the thickness direction of the device,
the first region includes a first impurity amount, and the second region includes a second impurity amount,
the periphery region includes an utmost outer periphery pair of the first and the second regions and an utmost inner periphery pair of the first and the second regions,
the utmost inner periphery pair is disposed next to the center region, and the utmost outer periphery pair is disposed on outmost of the periphery region,
the utmost outer periphery pair has a difference between the second impurity amount of the second region and the first impurity amount of the first region, the difference which is smaller than a maximum difference between the second impurity amount and the first impurity amount of another pair of the first and the second regions in the periphery region, and
the utmost inner periphery pair has a difference between the second impurity amount of the second region and the first impurity amount of the first region, the difference which is larger than a difference between the second impurity amount and the first impurity amount of a pair of the first and the second regions in the center region.

2. The device according to claim 1, wherein
the difference between the second impurity amount and the first impurity amount of a pair in the periphery region becomes larger as it goes from the utmost outer periphery pair to the utmost inner periphery pair, and
the difference between the second impurity amount and the first impurity amount of a pair in the center region is smaller than the difference between the second impurity amount and the first impurity amount of the utmost inner periphery pair.

3. The device according to claim 1, wherein
the first region in each of the center and the periphery regions has a constant width in a repeat direction of the first and the second regions,
the second region in each of the center and the periphery regions has a constant width in the repeat direction of the first and the second regions, and
the difference between the second impurity amount and the first impurity amount is controlled by at least one of the impurity concentrations of the first region and the second region.

4. The device according to claim 1, wherein
the utmost outer periphery pair of the first and the second regions in the periphery region has a sum of the first and the second impurity amounts of the first region and the second region, and
the sum of the utmost outer periphery pair is smaller than that of another pair of the periphery region.

5. A semiconductor device comprising:
a center region, in which a semiconductor switching device is disposed;
a periphery region surrounding the center region; and
a semiconductor layer including a plurality of pairs of a first region having a first conductive type and a second region having a second conductive type, wherein
the semiconductor layer is disposed from the center region to the periphery region,
the first and the second regions extend in a thickness direction of the device,
the first and the second regions are alternately aligned in a plane perpendicular to the thickness direction of the device,
the first region includes a first impurity amount, and the second region includes a second impurity amount,
the periphery region includes an utmost outer periphery pair of the first and the second regions and an utmost inner periphery pair of the first and the second regions,
the utmost inner periphery pair is disposed next to the center region, and the utmost outer periphery pair is disposed on outmost of the periphery region,
the utmost outer periphery pair has a difference between the second impurity amount of the second region and the first impurity amount of the first region, the difference which is smaller than a maximum difference between the second impurity amount and the first impurity amount of another pair of the first and the second regions in the periphery region,
the utmost inner periphery pair has a difference between the second impurity amount of the second region and the first impurity amount of the first region, the difference which is larger than a difference between the second impurity amount and the first impurity amount of a pair of the first and the second regions in the center region
the first region in each of the center and the periphery regions has a constant impurity concentration,
the second region in each of the center and the periphery regions has a constant impurity concentration,
the second region in each of the center and the periphery regions has a constant width in a repeat direction of the first and the second regions, and
the difference between the second impurity amount and the first impurity amount is controlled by a width of the first region in the repeat direction in each of the center and the periphery regions.

6. The device according to claim 5, wherein
the first region of the utmost outer periphery pair in the periphery region has a width, which is larger than a minimum width of the first region of another pair of the periphery region, and
the first region of the utmost inner periphery pair in the periphery region has a width, which is smaller than a width of the first region of a pair of the center region.

7. The device according to claim 6, wherein
the first region of the utmost outer periphery pair in the periphery region has a width, which is larger than a width of the first region of another pair of the periphery region, and
the first region of the utmost inner periphery pair in the periphery region has a width, which is smaller than a width of the first region of a pair of the center region.

* * * * *